United States Patent
Tanaka et al.

(10) Patent No.: US 9,595,606 B2
(45) Date of Patent: Mar. 14, 2017

(54) FIELD-EFFECT TRANSISTOR

(71) Applicant: Panasonic Intellectual Property Management Co., Ltd., Osaka (JP)

(72) Inventors: Kenichiro Tanaka, Osaka (JP); Shinichi Kohda, Kyoto (JP); Masahiro Ishida, Osaka (JP); Tetsuzo Ueda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/790,064

(22) Filed: Jul. 2, 2015

(65) Prior Publication Data
US 2015/0303293 A1 Oct. 22, 2015

Related U.S. Application Data

(63) Continuation of application No. PCT/JP2013/006450, filed on Oct. 31, 2013.

(30) Foreign Application Priority Data

Jan. 10, 2013 (JP) ................................ 2013-002543

(51) Int. Cl.
*H01L 29/778* (2006.01)
*H01L 29/36* (2006.01)
(Continued)

(52) U.S. Cl.
CPC ...... *H01L 29/7787* (2013.01); *H01L 29/0684* (2013.01); *H01L 29/205* (2013.01);
(Continued)

(58) Field of Classification Search
CPC ..................................................... H01L 29/778
See application file for complete search history.

(56) References Cited

U.S. PATENT DOCUMENTS 7,326,971 B2 * 2/2008 Harris ................. H01L 29/7783
257/194
8,212,288 B2 7/2012 Komiyama et al.
(Continued)

FOREIGN PATENT DOCUMENTS

| JP | 2000-068498 | 3/2000 |
|----|-------------|--------|
| JP | 2006-114655 | 4/2006 |

(Continued)

OTHER PUBLICATIONS

Masayuki Fukai Etc: "Role of carbon-related defects to high resistivity mechanism in silicon-doped GaN",2009 IEICE Sougoutaikai, Mar. 17-20, 2009, p. 13, C-6-8, Elekutoronikusu kouen bunsyu2, Matsuyama, Japan; with English translation.
(Continued)

*Primary Examiner* — Yu-Hsi D Sun
(74) *Attorney, Agent, or Firm* — McDermott Will & Emery LLP

(57) ABSTRACT

A field-effect transistor includes a codoped layer made of $Al_xGa_{1-x}N$ ($0 \leq x \leq 1$) and formed on a p-type Si substrate, a GaN layer formed on the codoped layer, and an AlGaN layer formed on the GaN layer. The codoped layer contains C and Si as impurity elements. The impurity concentration of C in the codoped layer is equal to or higher than $5 \times 10^{17}/cm^3$. The impurity concentration of Si in the codoped layer is lower than the impurity concentration of C. The impurity concentration of C in the GaN layer is equal to or lower than $1 \times 10^{17}/cm^3$. The thickness of the GaN layer is equal to or greater than 0.75 μm.

6 Claims, 17 Drawing Sheets

(51) Int. Cl.
H01L 29/207 (2006.01)
H01L 29/06 (2006.01)
H01L 29/205 (2006.01)
H01L 29/20 (2006.01)

(52) U.S. Cl.
CPC ............ *H01L 29/207* (2013.01); *H01L 29/36* (2013.01); *H01L 29/7786* (2013.01); *H01L 29/2003* (2013.01)

(56) References Cited

U.S. PATENT DOCUMENTS

| | | | |
|---|---|---|---|
| 2008/0296619 A1* | 12/2008 | Hsieh | H01L 21/187 257/190 |
| 2009/0189190 A1 | 7/2009 | Hashimoto et al. | |
| 2010/0230723 A1 | 9/2010 | Hashimoto et al. | |
| 2012/0025205 A1 | 2/2012 | Nakata et al. | |
| 2015/0303293 A1* | 10/2015 | Tanaka | H01L 29/36 257/76 |

FOREIGN PATENT DOCUMENTS

| | | |
|---|---|---|
| JP | 2006-332367 | 12/2006 |
| JP | 2007-251144 | 9/2007 |
| JP | 2012-033575 | 2/2012 |

OTHER PUBLICATIONS

Masayuki Fukai Etc:"Characteristics of AlGaN/GaN HFETs with C and Si co-doping high resistivity GaN buffer layer",2011 IEICE Elekutoronikusu sosaethi taikai, Sep. 13-16, 2011, p. 63, C-10-9, Elekutoronikusu kouen ronbunsyu2, Sapporo, Japan; with English translation.

Masayuki Fukai Etc:"Effect of C and Si co-doping high resistivity GaN buffer layer on AlGaN/GaN HFETs", Jul. 2011, p. 1-6 , IEICE Technical Report ED2011-37, The Institute of Electronics, Information and Communication Engineers, Japan; with English translation.

International Search Report of PCT application No. PCT/JP2013/006450 dated Jan. 28, 2014.

C.H.Seager et al., "Role of carbon in GaN", Journal of Applied Physics, vol. 92, No. 11, Dec. 1, 2002 pp. 6553-6560.

S.C.Binari et.al., "Fabrication and characterization of GaN FETs", Solid-State Electronics vol. 41, No. 10, pp. 1549-1554, 1997.

* cited by examiner

FIELD-EFFECT TRANSISTOR

BACKGROUND OF THE INVENTION

1. Field of the Invention

The present disclosure relates to field-effect transistors (FETs), and particularly, to nitride field-effect transistors that can be applied to power transistors.

2. Description of the Related Art

Nitride semiconductors have wider band gaps, higher breakdown electric field, and higher saturation drift velocity of electrons as compared to Si semiconductors or GaAs semiconductors. Further, in a heterostructure of AlGaN/GaN formed on a substrate whose main surface is the (0001) plane, two-dimensional electron gas (hereinafter referred to as the 2 DEG) is generated at the heterointerface by the spontaneous polarization and the piezoelectric polarization, and a sheet carrier concentration of about $1 \times 10^{13}$ cm$^{-2}$ or more is obtained even when impurities are not doped. In recent years, high electron mobility transistors (HEMTs) using this high-concentration 2 DEG as a carrier are receiving attention, and a variety of HEMT structures has been proposed (Non Patent Literature 1).

FIG. 11 is a cross-sectional view of a conventional field-effect transistor having an AlGaN/GaN heterostructure. In conventional field-effect transistor 900 shown in FIG. 11, on p-type Si substrate 901, AlN buffer layer 902, superlattice layer 903, undoped $Al_xGa_{1-x}N$ (0≤x≤1) layer 904, undoped GaN layer 905, and undoped AlGaN layer 906 are formed in this order, and source electrode 907 and drain electrode 909 are formed on undoped AlGaN layer 906. Gate electrode 908 is formed between source electrode 907 and drain electrode 909.

In such a structure, two-dimensional electron gas 910 formed at the interface of AlGaN and GaN is generated by the spontaneous polarization and the piezoelectric polarization, and used as a carrier. When a voltage is applied between source and drain, the electrons in the channel flows from source electrode 907 to drain electrode 909. At this time, by controlling the voltage applied to gate electrode 908 to vary the thickness of the depletion layer immediately below gate electrode 908, the drain current can be controlled.

CITATION LIST

Non Patent Literature

NPL 1: S. C. Binari, W. Kruppa, H. B. Dietrich, G. Kelner, A. E. Wickenden and J. A. Freitas Jr., "Fabrication and characterization of GaN FETs" Solid State Electrons 41 (1997) 1549-1554.

When a high voltage is applied to drain of a field-effect transistor in an OFF state, a so-called current collapse phenomenon occurs, i.e., the ON-state resistance increases when subsequently the field-effect transistor is switched to an ON state. The occurrence mechanism of the current collapse is shown, for example, in Non Patent Literature 1. In the following, a brief description of the occurrence mechanism of the current collapse will be given with reference to FIG. 12.

FIG. 12 is a cross-sectional view of the conventional field-effect transistor being turned OFF. Firstly, in an OFF state of field-effect transistor 900, a depletion layer region as represented by region 911 is generated. At this time, a high electric field is generated at region 912 on the drain terminal side relative to the depletion layer represented by region 911, and electrons are trapped in region 912. Next, when the trapped electrons are present near the two-dimensional electron gas, these trapped electrons bring about the effect that may be attained by application of a negative bias gate voltage. Accordingly, the concentration of the two-dimensional electron gas near the trapped electrons drops. Consequently, the ON-state voltage rises and the current when the device is turned ON reduces. This is the mechanism of the occurrence of the current collapse.

SUMMARY OF THE INVENTION

The present disclosure has been made taking into consideration of the above-described problem, and an object of the present disclosure is to provide a field-effect transistor with a reduced leakage current without triggering the current collapse when being turned OFF.

In order to solve the problem described above, a field-effect transistor according to an exemplary embodiment of the present disclosure includes: a first semiconductor layer made of a first nitride semiconductor and formed on a substrate; a second semiconductor layer made of a second nitride semiconductor and formed on the first semiconductor layer; and a third semiconductor layer made of a third nitride semiconductor with a wider band gap than the second nitride semiconductor and formed on the second semiconductor layer. The first semiconductor layer includes carbon (C) and Si as impurity elements. An impurity concentration of carbon (C) in the first semiconductor layer is equal to or higher than $5 \times 10^{17}$/cm$^3$. An impurity concentration of Si in the first semiconductor layer is lower than the impurity concentration of carbon (C). An impurity concentration of carbon (C) in the second semiconductor layer is equal to or lower than $1 \times 10^{17}$/cm$^3$. A thickness of the second semiconductor layer is equal to or greater than 0.75 μm.

By setting the concentration of C in the first semiconductor layer to be equal to or higher than $5 \times 10^{17}$/cm$^3$, the resistance of the first semiconductor layer can be raised. Further, by the first semiconductor layer containing Si as an impurity, deterioration of crystallinity due to doping of C can be suppressed. By doping the first semiconductor layer with Si and C, the leakage current can be reduced. On the other hand, when a high voltage is applied to the field-effect transistor in an OFF state, electrons are trapped by the first semiconductor layer which contains C and Si as impurities. These electrons have an extremely deep trap level. Since these electrons are negatively charged, they bring about the effect that may be realized by application of a negative bias to the channel, when the device is turned ON. Hence, the channel becomes narrow and the current collapse is triggered. On the other hand, since the second semiconductor layer does not contain any electron traps, the current collapse is not triggered. Hence, by fully separating the first semiconductor layer that triggers the current collapse from the channel region formed at the boundary between the second semiconductor layer and the third semiconductor layer, the channel can be suppressed from becoming narrow. That is, by setting the thickness of the second semiconductor layer to be equal to or greater than 0.75 μm, the first semiconductor layer and the channel region can be separated from each other by 0.75 μm or more. Thus, the leakage current can be reduced while suppressing the occurrence of the current collapse in an OFF state and at an actual operational voltage.

Further, for example, the first nitride semiconductor is made of $Al_xGa_{1-x}N$ ($0 \le x \le 1$). The second nitride semiconductor is made of GaN. The third nitride semiconductor is made of AlGaN.

Still further, for example, the first nitride semiconductor is made of $Al_xGa_{1-x}N$ ($0 \le x \le 1$) and $Al_yGa_{1-y}N$ ($0 \le y \le 1$, $x \ne y$). The first semiconductor layer is a superlattice layer made of the first nitride semiconductor. The second nitride semiconductor is made of GaN. The third nitride semiconductor is made of AlGaN.

Further, in order to solve the problem described above, a field-effect transistor according to an exemplary embodiment of the present disclosure includes: a first semiconductor layer made of a first nitride semiconductor stacked on a substrate; a second semiconductor layer made of a second nitride semiconductor and formed on the first semiconductor layer; and a third semiconductor layer made of a third nitride semiconductor with a wider band gap than the second nitride semiconductor and formed on the second semiconductor layer. The first semiconductor layer contains a first impurity having an ionization energy Ea and a concentration Na, and a second impurity having an ionization energy Ed smaller than the ionization energy Ea, and a concentration Nd smaller than the concentration Na. A trap level is formed at the first semiconductor layer, the trap level having an activation energy greater than a sum of the ionization energy Ea and the ionization energy Ed. An impurity concentration of carbon (C) in the second semiconductor layer is equal to or lower than $1 \times 10^{17}/cm^3$. A thickness of the second semiconductor layer is equal to or greater than 0.75 μm.

By the two types of impurities satisfying the relationship of the above-described ionization energy being contained in the first semiconductor layer, the leakage current can be reduced. Further, by setting the thickness of the second semiconductor layer to be equal to or greater than 0.75 μm, the first semiconductor layer and the channel region can be separated from each other by 0.75 μm or more. Thus, the leakage current can be reduced while suppressing the occurrence of the current collapse in an OFF state and at an actual operational voltage.

With the field-effect transistor of the present disclosure, it becomes possible to realize a reduction in the leakage current when the device is turned OFF, without deteriorating the current collapse.

DETAILED DESCRIPTION OF THE PREFERRED EMBODIMENTS

Knowledge on which the Present Disclosure is Based

The present inventors have found the following problems in the conventional field-effect transistor described in "Description of the Related Art".

Figure 11:
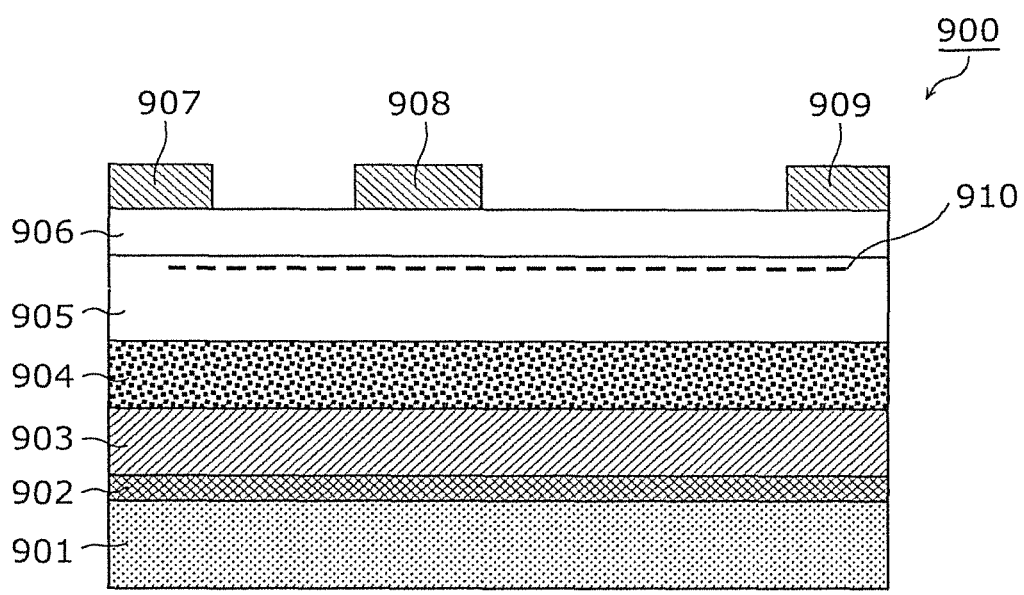
FIG. 11 is a cross-sectional view of a conventional field-effect transistor having an AlGaN/GaN heterostructure.
Figure 12:
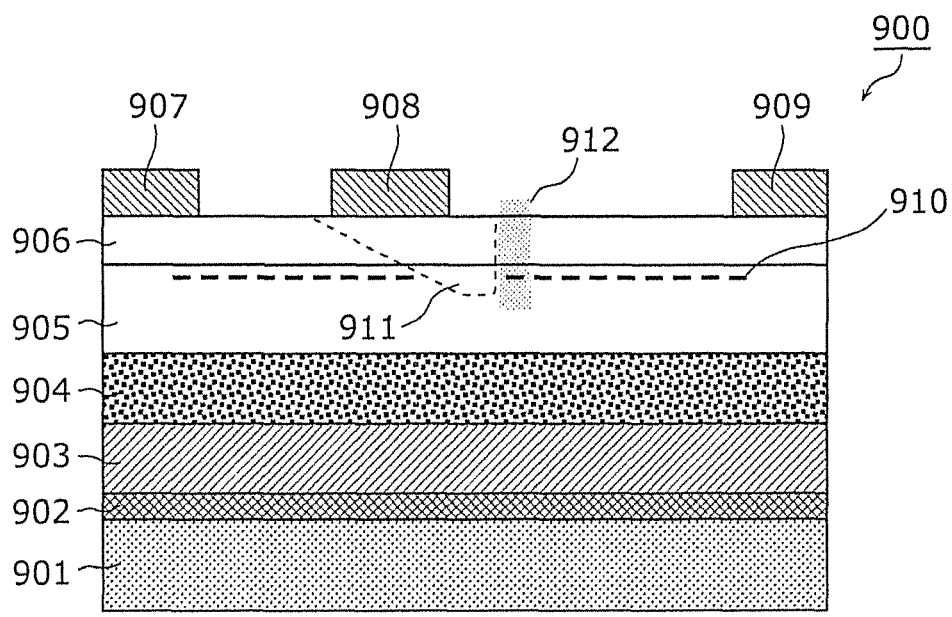
FIG. 12 is a cross-sectional view of a conventional field-effect transistor when turned OFF.
Figure 13:
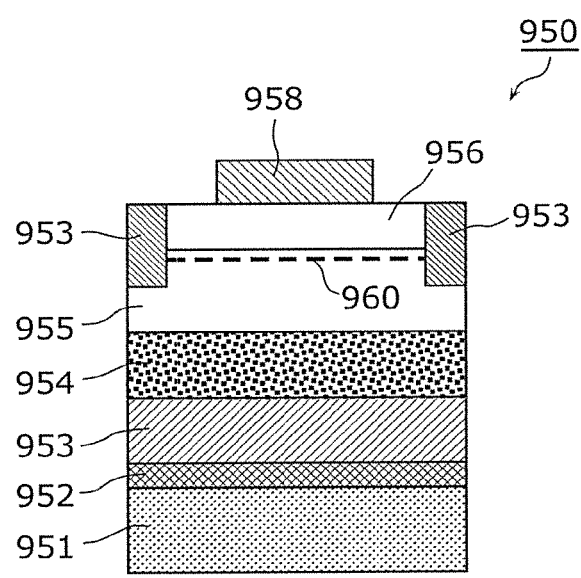
FIG. 13 is a cross-sectional view of a device for evaluating an accelerated life test of a GaN epitaxial film formed on a Si substrate.
Figure 14A:
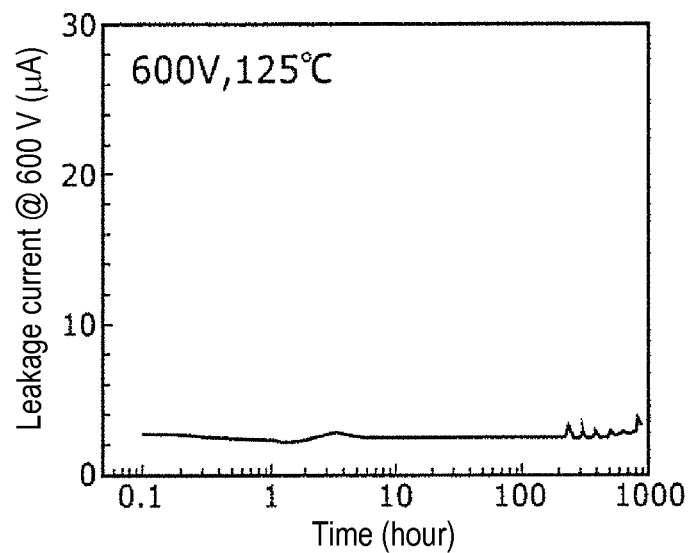
FIG. 14A is a graph showing the leakage current characteristic in a case where a voltage of 600 V is applied to a conventional field-effect device.
Figure 14B:
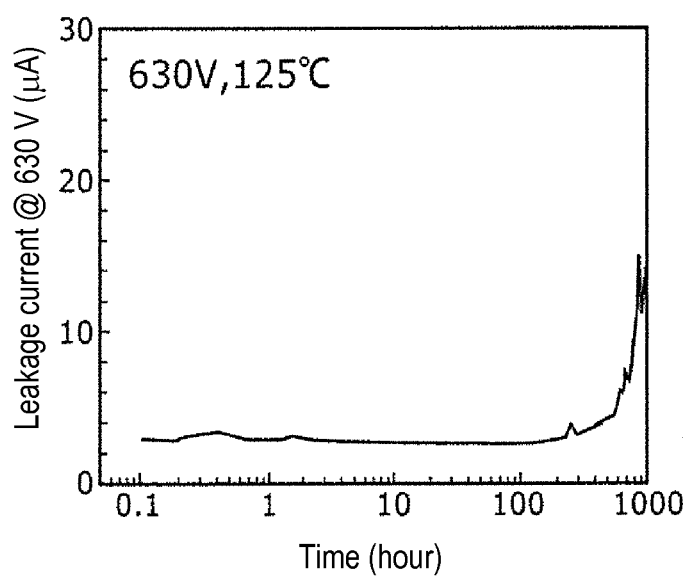
FIG. 14B is a graph showing the leakage current characteristic in a case where a voltage of 630 V is applied to the conventional field-effect device.
Figure 14C:
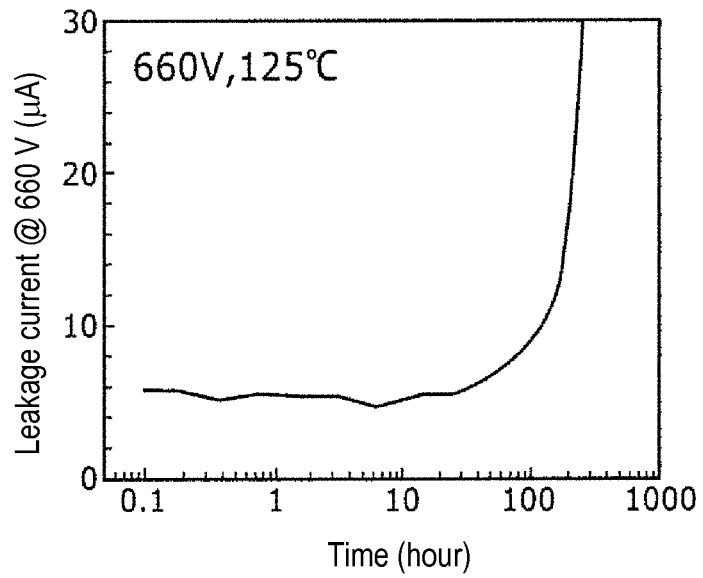
FIG. 14C is a graph showing the leakage current characteristic in a case where a voltage of 660 V is applied to the conventional field-effect device.
Figure 14D:
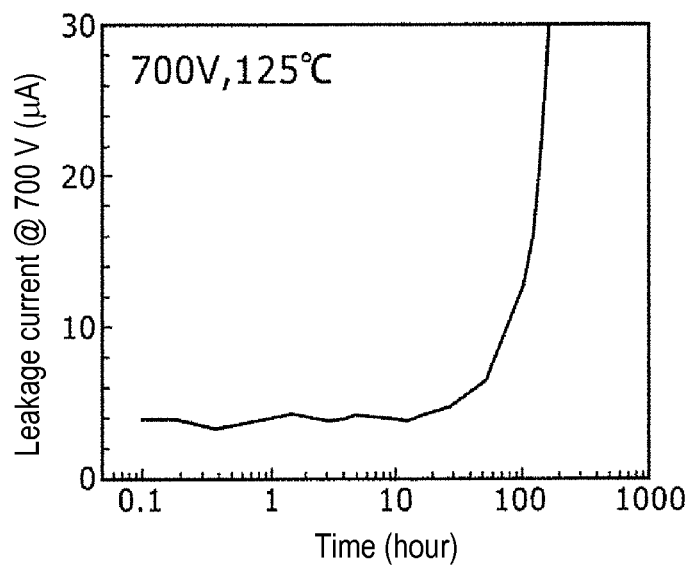
FIG. 14D is a graph showing the leakage current characteristic in a case where a voltage of 700 V is applied to the conventional field-effect device.

FIG. 13 is a cross-sectional view of a device for evaluating an accelerated life test of a GaN epitaxial film formed on a Si substrate. In field-effect device 950 having the layer structure identical to the layer structure of field-effect transistor 900 shown in FIG. 11, two-dimensional electron gas 960 is formed between separation regions 953 formed by ion injection. Further, Al electrode 958 is formed on epitaxial layer 956 surrounded by separation regions 953. Threading dislocations of about $10^{10}/cm^2$ are present at undoped GaN layer 955 formed on a Si substrate 951. Such dislocations may significantly affect the reliability of the device. Accordingly, the reliability of the epitaxial film was evaluated by an accelerated aging test, which was carried out by applying a voltage to undoped GaN layer 955 on Si substrate 951 in the vertical direction (the thickness direction), and accelerating aging by the temperature.

The evaluation method was as follows. Conductive Si substrate 951 was grounded, and a positive bias voltage (600 V to 700 V) was applied for a period $t_i$ (i=1, 2, 3 . . . ) to Al electrode 958 (electrode area 0.785 mm$^2$) formed on the surface of epitaxial layer 956. Then, the bias voltage was released, and thereafter leakage current ($I_i$) was measured with application of 600 V to the device. This procedure was repeatedly performed.

FIGS. 14A to 14D are graphs showing the leakage current characteristic in the cases where voltages of 600 V, 630 V, 660 V, and 700 V are applied to the conventional field-effect device, respectively. Specifically, FIGS. 14A to 14D show the relationship at 125° C. between the leakage currents obtained by the above-described evaluation with the applied voltages 600 V to 700 V and the total bias applied time ($t_1+t_2+t_3+$ . . . ). It can be seen that, with any of the applied biases, the leakage current sharply rises at a certain time. Further, it can also be seen that, as the applied biases become higher, the total bias applied time at which the leakage current sharply rises is reached earlier.

Figure 15:
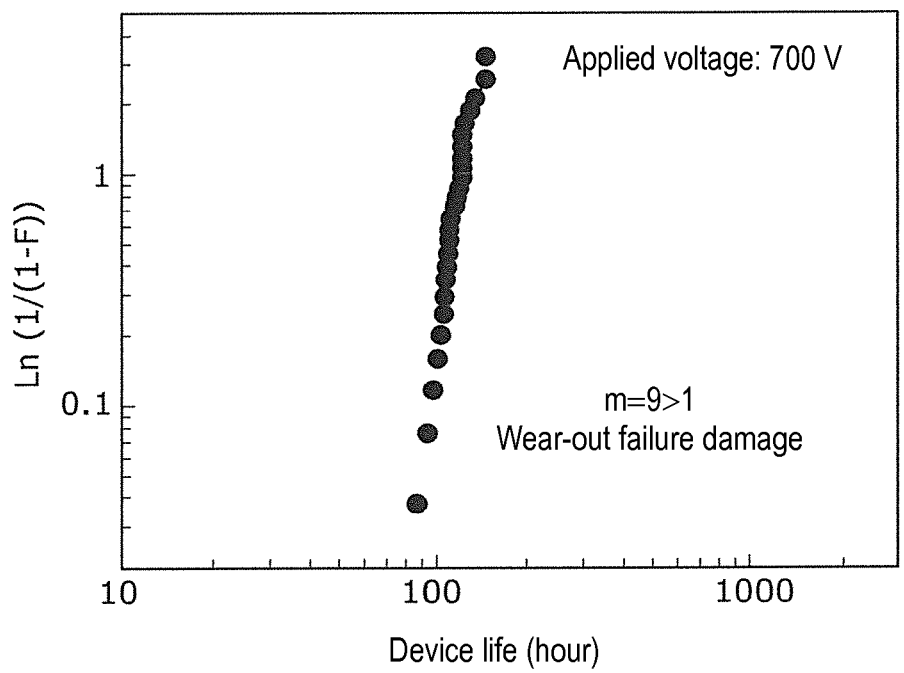
FIG. 15 is a graph showing a Weibull plot of the device life when an applied bias voltage is 700 V.

FIG. 15 is a graph showing a Weibull plot of the device life when the applied bias voltage is 700 V. Here, the device life is defined by the time when a leakage current of 15 μA flows. According to a result of the Weibull plot, the gradient can be represented by just a single type. Thus, it is understood that the failure mode is just a single type. From the obtained Weibull plot, the m value is 9, i.e., greater than 1. Thus, it can be seen that the failure type is only the wear-out failure mode.

Figure 16:
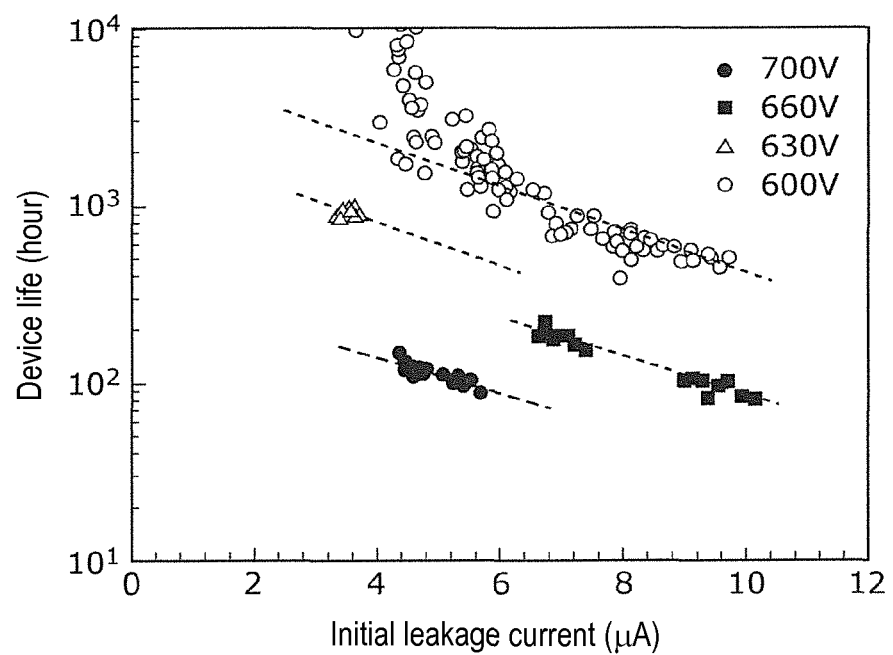
FIG. 16 is a graph showing the relationship between the device life and initial leakage current.

FIG. 16 is a graph showing the relationship between the device life and the initial leakage current. There is a strong correlation between the device life and the initial leakage current. The life tends to be longer when the initial leakage current is smaller. From the foregoing, it is very important to suppress the initial leakage current for securing the reliability of the device.

However, as will be described later, in some cases, when the layer structure is changed for suppressing the leakage current of the device, the current collapse deteriorates as the side effect. Accordingly, in designing the device, it must be intended not only to reduce the leakage current, but also to prevent deterioration of the current collapse.

In the following, how the present inventors have found the technique of reducing the leakage current while suppressing the current collapse will be described.

Generally, it is known that, while GaN becomes n-type without being doped with impurities because of the influence by a residual donor, introduction of Fe or C serving as the deep acceptor in GaN can raise the resistance because the residual carrier are compensated for (Non Patent Literature 2 (S. Heikman, S. Keller, S. P. DenBaars, U. K. Mishra, "Growth of Fe doped semi-insulating GaN by metalorganic chemical vapor deposition." Applied Physics Letters 81 (2002) 439-441), Non Patent Literature 3 (J. B. Webb, H. Tang, S. Rolfe and J. A. Bardwell, "Semi-insulating C-doped GaN and high-mobility AlGaN/GaN heterostructures grown by ammonia molecular beam epitaxy." Applied Physics Letters 75 (1999) 953-955)).

However, when the growth through MOCVD is performed, introduction of Fe is not desirable because Fe causes a great memory effect and contaminates the reactor. Further, when Fe is introduced into the buffer layer, Fe is inevitably introduced into the region near the two-dimensional electron gas because of the memory effect of Fe. It is known that Fe causes the collapse at this timing. Accordingly, it is not desirable to introduce Fe into a GaN epitaxial film.

On the other hand, carbon (C) is mixed from group III materials in the growth through MOCVD. Since the mixed amount can be controlled by the growth temperature, the growth pressure and the V/III ratio, it is less disadvantageous as compared to introduction of Fe.

According to the first-principles calculation, the mechanism of raising the resistance by introducing C into GaN functions because $C_N$ (C at the N position) compensates for $V_N$ vacancies (vacancies at the N position). Here, it is known that it is desirable to introduce C of about 1×10$^{19}$/cm$^3$ or higher in order to raise the resistance of the GaN epitaxial film by C (Non Patent Literature 4 (C. H. Seager, A. F. Wright, J. Yu and W. Gotz, "Role of carbon in GaN." Journal of Applied Physics 92 (2002) 6553)). However, when C of such a high concentration is introduced into a GaN epitaxial film, defects and traps are likely to be generated at the same time.

On the other hand, Non Patent Literature 4 discloses a method for raising the resistance of a GaN epitaxial film by, instead of introducing C of high concentration, codoping Si simultaneously with C while suppressing the concentration of C to about 5×10$^{17}$/cm$^3$.

According to the first-principles calculation, the mechanism of raising the resistance of a GaN epitaxial film by codoping C and Si functions because $Si_{Ga}$ (Si at the Ga position) compensates for $C_N$ (C at the N position). Therefore, provided that the resistance can be raised by the codoping, deterioration in crystallinity may be suppressed because the concentration of C can be suppressed as compared to the case where the resistance of GaN is raised solely by C. Further, the reduced concentration of C enables growth at high temperatures. Hence, a reduction in the concentration of $V_N$ defects can be expected.

On the other hand, when a high voltage is applied to a field-effect transistor in an OFF state, electrons are trapped by the GaN layer which contains C and Si as impurities. These electrons have an extremely deep trap level. Since these electrons are negatively charged, they bring about the effect that may be realized by application of a negative bias to the channel, when the device is turned ON. Therefore, the channel becomes narrow and the current collapse occurs. In contrast, since no electron traps exist at the layer on the GaN layer doped with C and Si, the current collapse is not triggered. Hence, by fully separating the GaN layer that triggers the current collapse from the channel region formed at the upper layer, the channel can be prevented from becoming narrow. Thus, since the GaN layer doped with C and Si and the channel region can be separated from each other by setting the thickness of the upper layer to at least a prescribed value, the leakage current can be reduced while suppressing the occurrence of the current collapse in an OFF state and at an actual operational voltage.

In the following, with reference to the drawings, a description will be given of exemplary embodiments of the present disclosure in detail.

Note that, the exemplary embodiments described in the following are merely specific examples of the present disclosure. The numerical values, shapes, materials, constituents, arranged position of the constituents and the manner of connection shown in the following exemplary embodiments are examples, and not intended to limit the present disclosure. The present disclosure is specified by the scope of claims. Hence, among the constituents described in the following exemplary embodiments, though those not described in independent claims which represent the most generic terms of the present disclosure are not necessarily essential for achieving the object of the present disclosure, they are shown as the constituents that structure more preferred modes.

First Exemplary Embodiment

Figure 1:
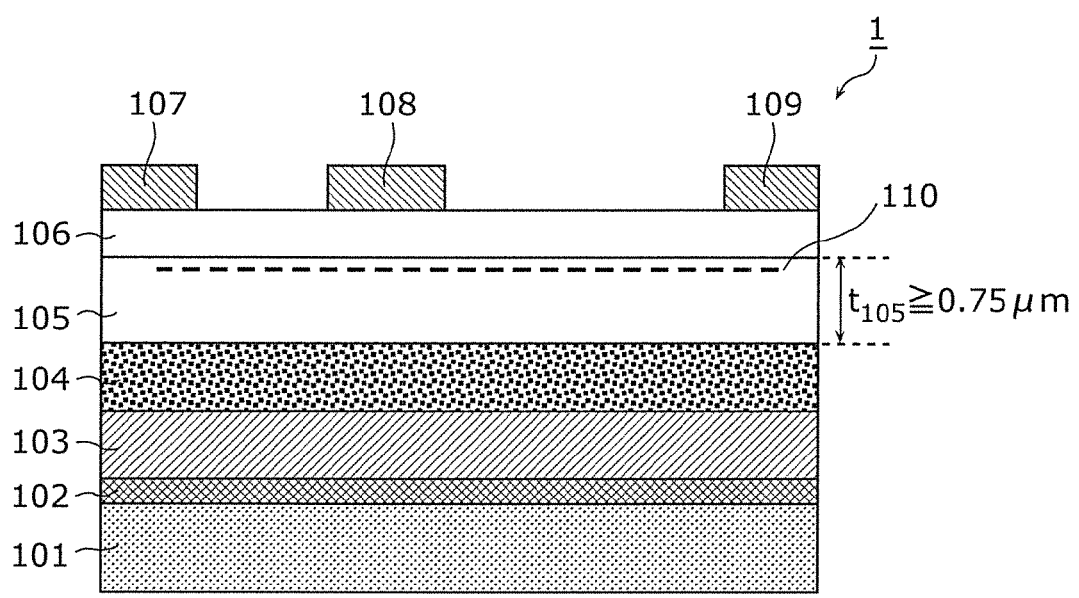
FIG. 1 is a cross-sectional view of a field-effect transistor according to a first exemplary embodiment.

FIG. 1 is a cross-sectional view of a field-effect transistor according to a first exemplary embodiment. In field-effect transistor 1 shown in FIG. 1, what are stacked in order on p-type Si substrate 101 are: AlN buffer layer 102 by a thickness of 200 nm; superlattice layer 103 by a thickness of 2 μm, superlattice layer 103 being made up of 5 nm of AlN and 20 nm of GaN; codoped layer 104 codoped with Si and C by a thickness of 850 nm; undoped GaN layer 105 by a thickness of 500 nm, the concentration of C in undoped GaN layer 105 being set to be equal to or less than $5 \times 10^{17}/cm^3$ for suppressing the current collapse; and undoped AlGaN layer 106 by a thickness of 50 nm. Further, on undoped AlGaN layer 106, source electrode 107 and drain electrode 109 made of Ti and Al are formed. In field-effect transistor 1, two-dimensional electron gas 110 that is present between undoped GaN layer 105 and undoped AlGaN layer 106 is used as a channel. Gate electrode 108 is formed between source electrode 107 and drain electrode 109. Here, gate electrode 108 is formed by stacking a p-type AlGaN layer and a p-type GaN layer in order, and thereafter by depositing Pd/Au as an electrode.

Codoped layer 104 is a first semiconductor layer formed by $Al_xGa_{1-x}N$ ($0 \leq x \leq 1$) being a first nitride semiconductor. Here, codoped layer 104 which is formed for reducing leakage is doped with Si as the donor by $1 \times 10^{17}/cm^3$ and carbon (C) as the acceptor by $5 \times 10^{17}/cm^3$.

Note that, C being doped as the acceptor is introduced by auto-doping during the MOCVD growth. On the other hand, Si being the donor is intentionally doped. Further, in order to form a highly insulating GaN epitaxial film, the concentration of Si used for compensating for C functioning as the acceptor must not exceed the concentration of C, because GaN becomes conductive when the concentration of Si exceeds the concentration of C. That is, codoped layer 104 contains carbon (C) and Si as the impurity elements. Further, the concentration of C is equal to or higher than $5 \times 10^{17}/cm^3$, and the concentration of Si is lower than the concentration of C.

Further, undoped GaN layer 105 is a second semiconductor layer formed by GaN being a second nitride semiconductor, and the concentration of C in undoped GaN layer 105 is equal to or lower than $1 \times 10^{17}/cm^3$.

Still further, a thickness $t_{105}$ of undoped GaN layer 105 is equal to or greater than 0.75 μm.

Undoped AlGaN layer 106 is formed on undoped GaN layer 105. Undoped AlGaN layer 106 is a third semiconductor layer formed by AlGaN being a third nitride semiconductor with a wider band gap as compared to that of the second nitride semiconductor.

In the following, with reference to FIGS. 2 to 9, a description will be given of the reason why the impurity concentration of codoped layer 104 and undoped GaN layer 105, and the thickness of undoped GaN layer 105 are set to fall within the above ranges, and the effect attained thereby.

Figure 2:
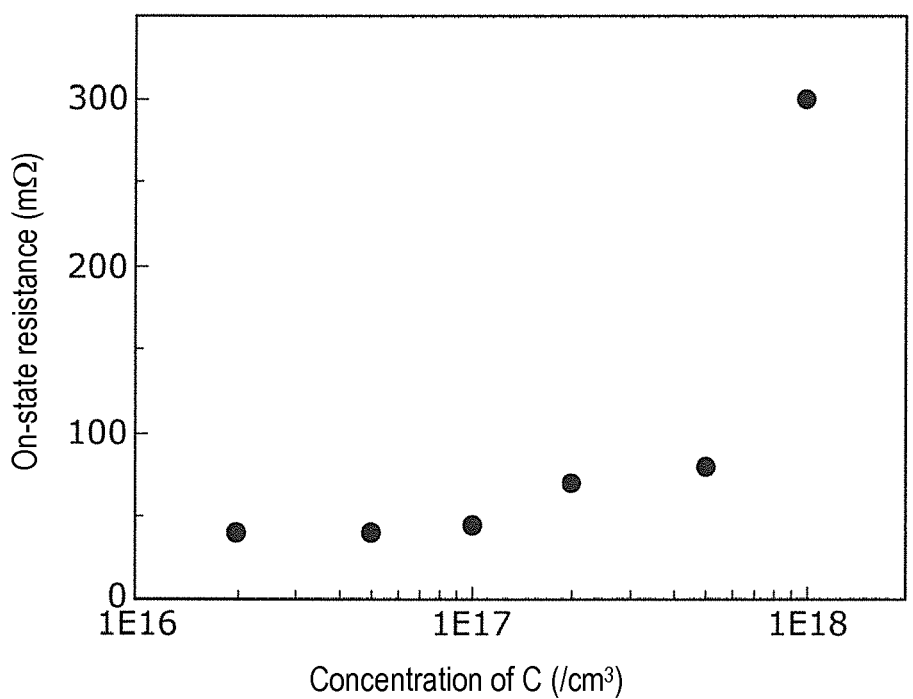
FIG. 2 is a graph showing the relationship between the concentration of C in an undoped GaN layer and an ON-state resistance at switching.

FIG. 2 is a graph showing the relationship between the concentration of C in the undoped GaN layer and the ON-state resistance at switching. Specifically, the graph of FIG. 2 shows the relationship between the concentration of C in the undoped GaN layer and the ON-state resistance at switching when field-effect transistor 1 is applied with a voltage of 400 V. When the concentration of C in undoped GaN layer 105 becomes equal to or higher than $1 \times 10^{17}/cm^3$, the ON-state resistance at switching disadvantageously rises. Accordingly, the concentration of C in undoped GaN layer 105 must be equal to or less than $1 \times 10^{17}/cm^3$.

Further, the concentration of C in codoped layer 104 must be equal to or higher than $5 \times 10^{17}/cm^3$.

Figure 3:
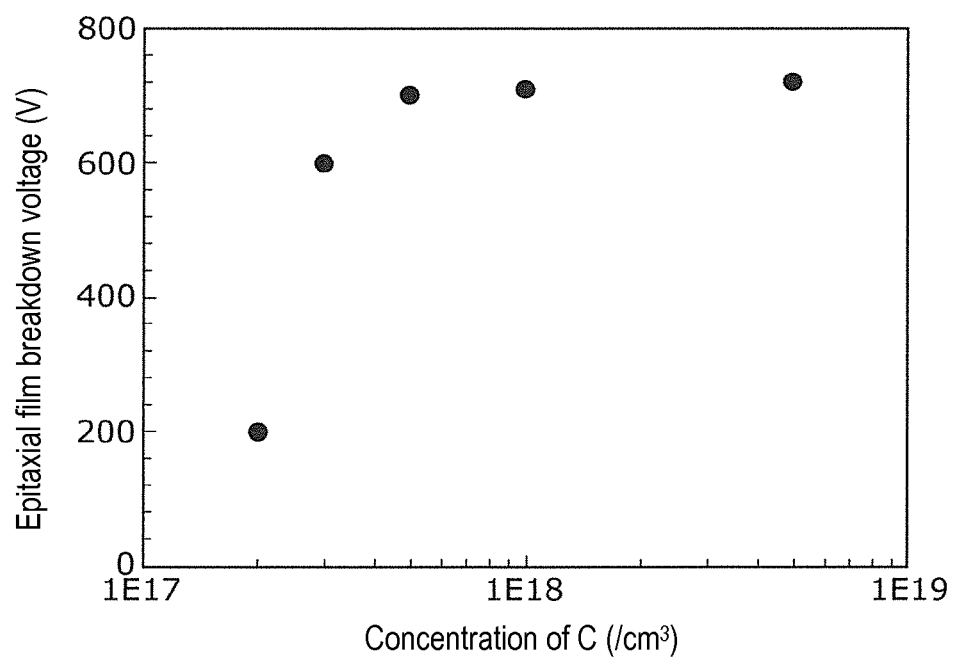
FIG. 3 is a graph showing the relationship between the concentration of C in a codoped layer and an epitaxial film breakdown voltage.

FIG. 3 is a graph showing the relationship between the concentration of C in the codoped layer and the epitaxial film breakdown voltage. Note that, the concentration of Si in codoped layer 104 is fixed to $1 \times 10^{17}/cm^3$. As a result, it is found that, when the concentration of C is equal to or less than $5 \times 10^{17}/cm^3$, a high breakdown voltage cannot be secured. Accordingly, when the layer is codoped also, the concentration of C must be equal to or higher than $5 \times 10^{17}/cm^3$.

In the following, field-effect transistor 1 according to the present exemplary embodiment structured as described above and a field-effect transistor according to Comparative Example are compared against each other. Here, the field-effect transistor according to Comparative Example is a field-effect transistor including a layer doped solely with C, instead of being codoped with C and Si, so as to raise the resistance.

The field-effect transistor according to Comparative Example is different from field-effect transistor 1 in that codoped layer 104 is replaced by a doped layer doped with solely C by $1 \times 10^{19}/cm^3$. That is, what are stacked in order on p-type Si substrate 101 are: AlN buffer layer 102 by a thickness of 200 nm; superlattice layer 103 made of AlN and GaN layers by a thickness of 2 μm: a doped layer doped solely with C by $1 \times 10^{19}/cm^3$ by a thickness of 850 nm; undoped GaN layer 105 by a thickness of 500 nm; and undoped AlGaN layer 106 by a thickness of 50 nm. A source electrode, a drain electrode and a gate electrode are similarly structured as field-effect transistor 1.

Figure 4:
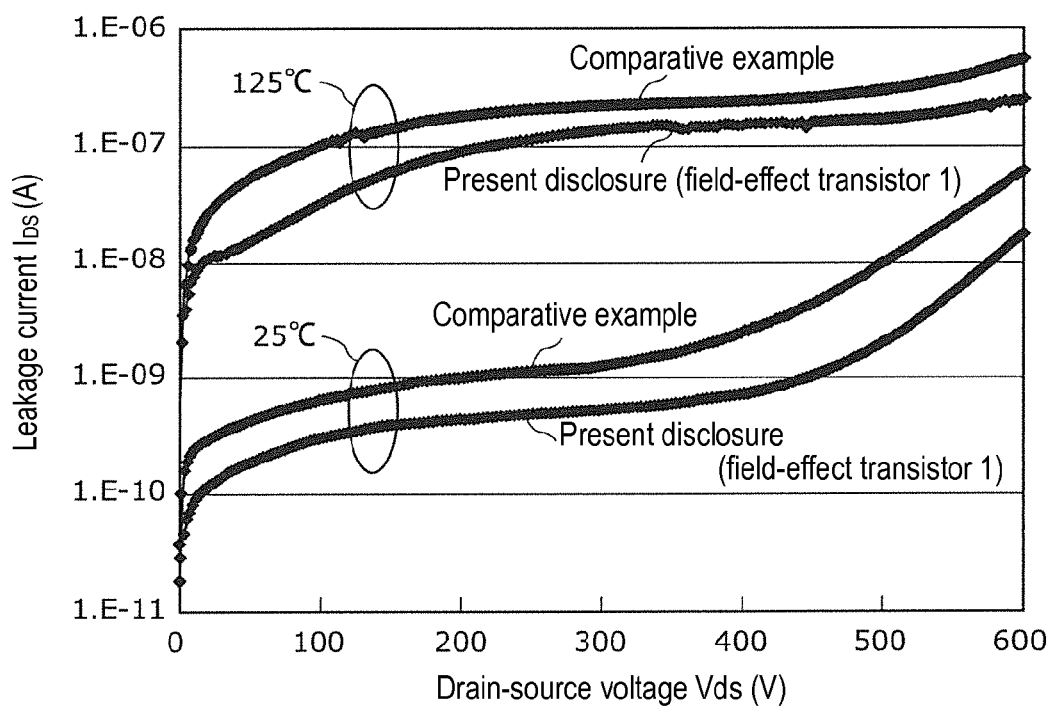
FIG. 4 is a graph showing the relationship between a drain-source leakage current $I_{DS}$ and a drain-source voltage $V_{DS}$ in an OFF state in a field-effect transistor according to a first exemplary embodiment and in Comparative Example.

FIG. 4 is a graph showing the relationship between a drain-source leakage current $I_{DS}$ and a drain-source voltage $V_{DS}$ in an OFF state in the field-effect transistor according to the present exemplary embodiment and in Comparative Example. The graph of FIG. 4 shows the current-voltage ($I_{DS}$-$V_{DS}$) characteristic at 125° C. and 25° C. when a gate-source voltage $V_{GS}$ is 0 V. At both of the temperatures 25° C. and 125° C., the leakage current is lower in field-effect transistor 1 according to the present exemplary embodiment in which codoped layer 104 is employed as the buffer layer than in Comparative Example in which no codoped layer is employed. It can be seen that the effect of a reduced leakage current is exhibited by employment of codoped layer 104.

Next, a description will be given of the effect on the current collapse brought about by employment of codoped layer 104, by comparing the switching characteristic of field-effect transistor 1 and that of Comparative Example against each other.

Figure 5:
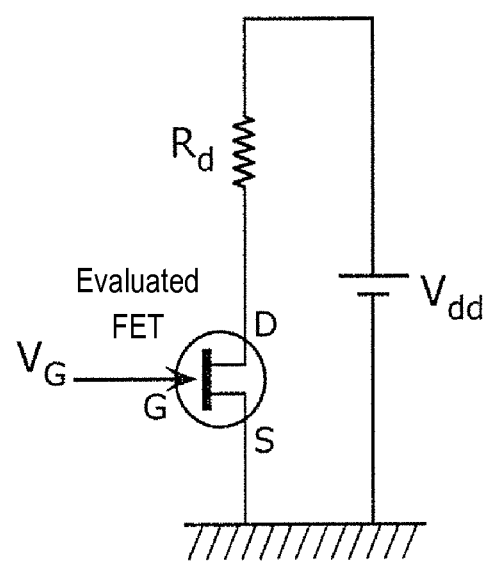
FIG. 5 is a schematic diagram of an electric circuit for evaluating the switching characteristic of a device.

FIG. 5 is a schematic diagram of an electric circuit for evaluating the switching characteristic of a device. A load resistor $R_d$ is connected in series to the drain terminal of a device (the evaluated FET), and an external voltage $V_{dd}$ is applied. A gate-source voltage $V_{GS}$ of the evaluated FET is controlled, and the evaluated FET is switched between ON/OFF states. Then, a drain voltage $V_{DS}$ is read. From the read drain voltage $V_{DS}$, ON-state resistance $R_{ON}=V_{dd}/\{(V_{dd}-V_{DS})/R_d\}$ at switching is determined. Then, the transient response $R_{ON}(t)$ of the ON-state resistance is obtained.

The current collapse is discussed. As described above, firstly, when the device is turned OFF, a strong electric field is applied to the region near the 2 DEG, and electrons are trapped in this region. Next, when the device is turned ON, the trapped electrons near the 2 DEG narrow the 2 DEG. Accordingly, the resistance when the device is turned ON ($R_{ON}$) rises, whereby the current collapse occurs. Accordingly, by examining in detail the transient response of the ON-state resistance $R_{ON}$ of the device after the device is switched from an OFF state to an ON state, the process of the trapped electrons being discharged can be examined. Additionally, by acquiring the temperature dependence of the discharge process, the trap energy of the electrons can be learned.

Figure 6:
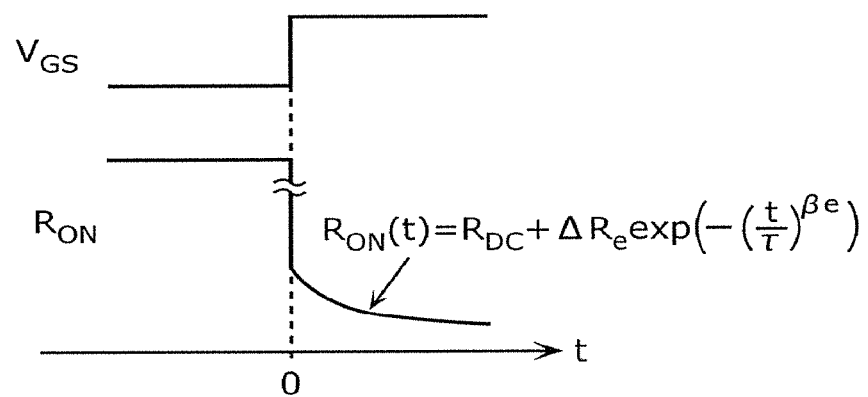
FIG. 6 is a diagram schematically showing the transient response of a gate-source voltage and an ON-state resistance.

FIG. 6 is a diagram schematically showing the gate-source voltage and the transient response of the ON-state resistance. Here, t is the elapsed time from the time point immediately after the evaluated FET transits from an OFF state to an ON state. Next, the obtained ON-state resistance $R_{ON}$ (t) is subjected to fitting by "stretched exponential function" shown in Equation 1.

$$R_{ON}(t) = R_{DC} + \Delta R_e \exp(-(t/\tau)^{\beta_e}) \quad \text{(Equation 1)}$$

Where a time constant τ is a relaxation time constant of the ON-state resistance $R_{ON}$ of the evaluated FET in an ON state, and is a time constant of the discharge process of traps that trigger the collapse. Note that, in Equation 1, $R_{DC}$ is $R_{ON}$ when there is no increase in the ON-state resistance due to the collapse, $\Delta R_e$ is an increase amount of $R_{ON}$ when t=0, and βe is an index. The foregoing procedure is performed while varying the temperature of the evaluated FET. τ at each temperature is determined, and the determined τ is expressed by an Arrhenius plot. Since τ represents the time constant of discharge of electrons captured in an OFF state of the evaluated FET, the potential energy of the captured electrons can be obtained by expressing the temperature dependence by the Arrhenius plot.

Figure 7A:
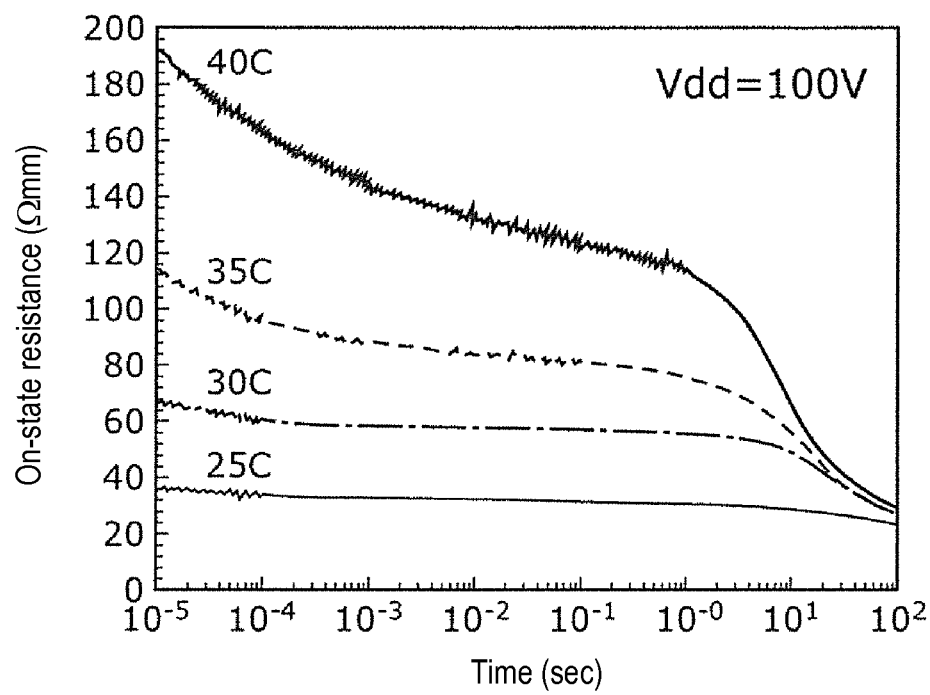
FIG. 7A is a graph showing the time dependence of the ON-state resistance after the field-effect transistor according to the first exemplary embodiment is switched from an OFF state to an ON state.
Figure 7B:
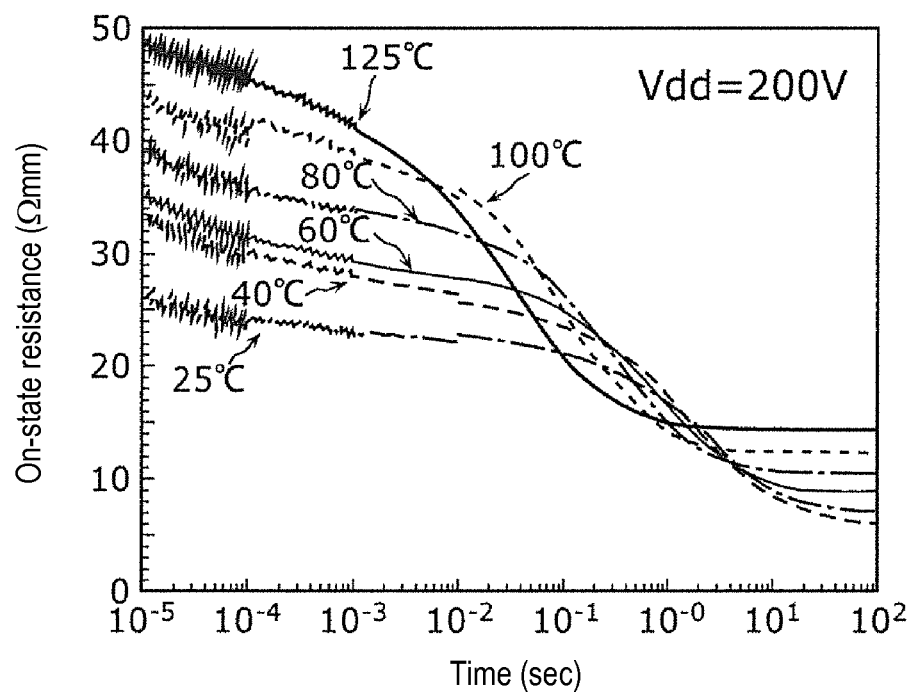
FIG. 7B is a graph showing the time dependence of the ON-state resistance after Comparative Example is switched from an OFF state to an ON state.

FIGS. 7A and 7B are graphs showing the time dependence of the ON-state resistance after field-effect transistor 1 according to the first exemplary embodiment and Comparative Example are switched from an OFF state to an ON state, respectively. Note that, the characteristic in FIG. 7A is the result when $V_{dd}$=100 V, and the characteristic in FIG. 7B is the result when $V_{dd}$=200 V. When FIGS. 7A and 7B are compared against with each other, the ON-state resistance at switching is great with field-effect transistor 1 according to the present exemplary embodiment. This is because of frequent occurrence of the collapse, and therefore field-effect transistor 1 according to the first exemplary embodiment is measured with the voltage lower than the voltage applied to the Comparative Example. Thus, the collapse is more significant in field-effect transistor 1 including codoped layer 104 than in Comparative Example not including a codoped layer. In order to find the cause of this phenomenon, the depth of the level of trapped electrons being the origin of the trapping was examined by the following method, from the switching waveform obtained in FIGS. 7A and 7B.

Figure 8A:
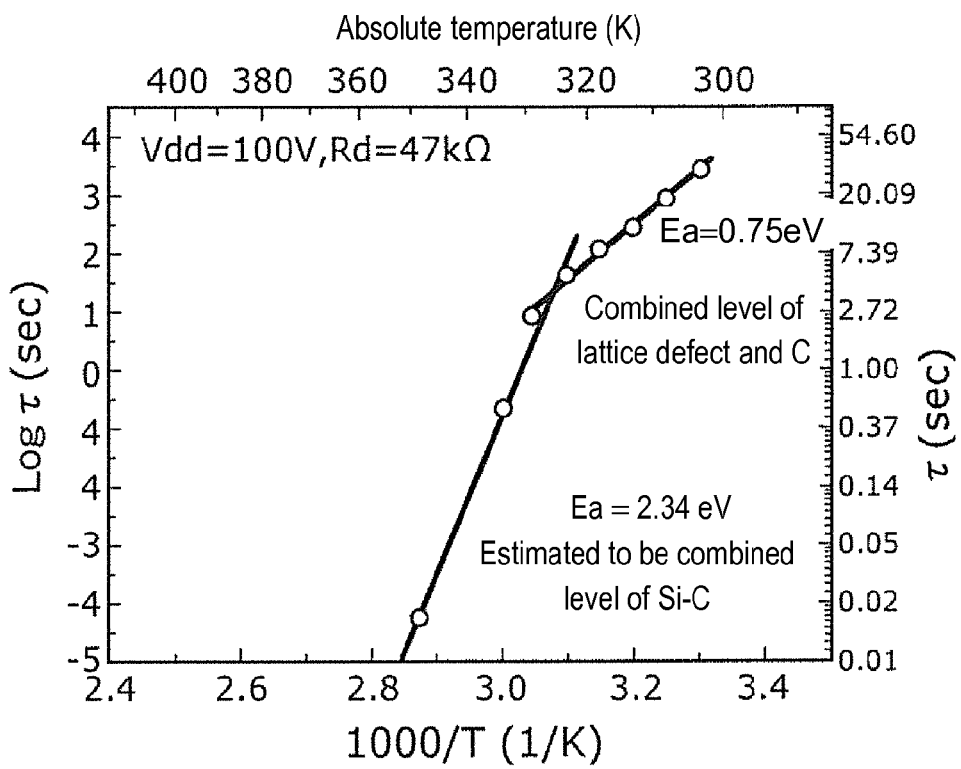
FIG. 8A is a graph showing an Arrhenius plot of τ obtained by fitting to the time dependence of the ON-state voltage of the field-effect transistor according to the first exemplary embodiment.
Figure 8B:
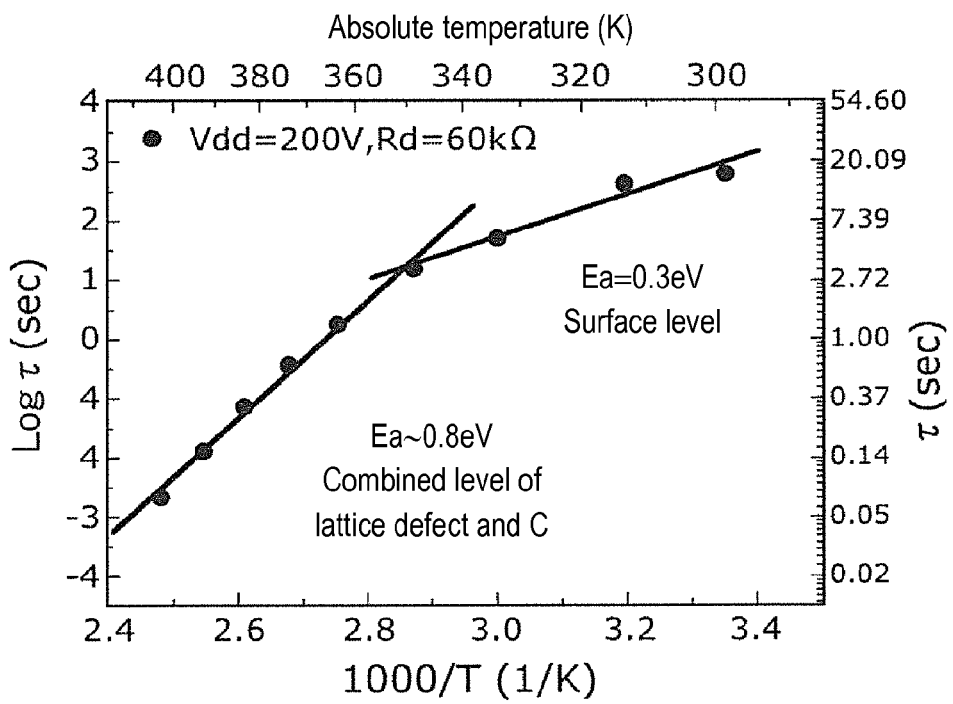
FIG. 8B is a graph showing an Arrhenius plot of τ obtained by fitting to the time dependence of the ON-state voltage of Comparative Example.

FIGS. 8A and 8B are graphs showing Arrhenius plots of τ obtained by fitting to the time dependence of the ON-state voltage of field-effect transistor 1 according to the first exemplary embodiment and Comparative Example, respectively.

Firstly, in Comparative Example including no codoped layer, as shown in FIG. 8B, it was found that there are two levels of the potential energy Ea, namely 0.3 eV and 0.8 eV. From the magnitude of the energy, it is considered that the physical origin of level 0.3 eV is attributed to the surface level, and the physical origin of level 0.8 eV is attributed to an electron trap contained in the GaN crystal. This is based on Non Patent Literature 5 (S. Rumyantsev, M. E. Levinshtein, R. Gaska, M. S. Shur, J. W. Yang, and M. A. Khan, "Low-frequency noise in AlGaN/GaN heterojunction field effect transistors on SiC and sapphire substrates." Journal of Applied Physics 87 (2000) 1849) and Non Patent Literature 6 (M. Neuburger, I. Daumiller, M. Kunze, J. van Nostrand and E. Kohn. "Influence of polarization on the properties of GaN based FET structures." Phys. Stat. Sol. (c) 0.1919 (2003).), disclosing that the thermal activation energy of the surface level is 0.3 eV to 0.4 eV from the temperature dependence of the frequency dispersion of the drain current, and based on Non Patent Literature 7 (Tamotsu Hashizume, "Deep electronic level of GaN and AlGaN—focusing on electrical evaluation result—", Journal of the Japanese Association for Crystal Growth, October 2009) disclosing an energy level (0.7 eV to 0.9 eV) of an electron trap in a GaN layer bulk. Accordingly, the 0.3 eV is close to the surface level and the 0.8 eV is close to the energy level of an electron trap.

In contrast, in connection with field-effect transistor 1 according to the present exemplary embodiment, as disclosed in FIG. 8A, it was found that there are two levels of electronic potential energy, namely, 0.8 eV and 2.3 eV. The level of depth 0.3 eV which may be attributed to the surface appearing in Comparative Example was not observed. This may be attributed to the relatively great signal intensity at the levels of 0.8 eV and 2.3 eV.

Further, with field-effect transistor 1, the level of depth 2.3 eV, which did not appear when Comparative Example was switched, was observed. This level characteristically appears with the field-effect transistor including the codoped layer and, therefore, this level is considered to be the level newly appeared by the codoped C and Si. It is considered that, because of the extremely deep energy formed by the newly generated level, the effect of suppressing the leakage current was brought about. That is, codoped layer 104 includes a first impurity C having an ionization energy Ea (e.g., 0.8 eV) and a concentration Na, and a second impurity Si having an ionization energy Ed (e.g., 0.03 eV) being smaller than the ionization energy Ea, and a concentration Nd being smaller than the concentration Na. Further, codoped layer 104 also involves a trap level whose activation energy (e.g., 2.3 eV) is greater than the sum (e.g., 0.83 eV) of the ionization energy Ea and the ionization energy Ed.

On the other hand, a problem was found that the current collapse extremely deteriorates in the device employing the codoped layer as the buffer layer by being influenced by the deep level, as compared to the device employing no codoped layer as the buffer layer.

Accordingly, in employing codoped layer 104 as the buffer layer, the present inventors further considered whether the electron trap having a deep potential energy formed in codoped layer 104 could be prevented from exhibiting the disadvantageous effect when the device is switched ON, by increasing the thickness of undoped GaN layer 105 formed on codoped layer 104.

As a result, it was found that, by setting the thickness $t_{105}$ of undoped GaN layer 105 to be equal to or greater than 0.75 μm, the ON-state resistance when switched at a voltage $V_{dd}$=400 V, i.e., the voltage used to drive the device, became twice as great as the DC resistance or less than that, achieving the practically usable level.

Specifically, variations of the structure of the field-effect transistor shown in FIG. 1 were fabricated in which the thickness ($t_{105}$ in the drawing) of the undoped GaN layer formed on codoped layer 104 was varied to 0.5 µm, 0.75 µm, 1.0 µm and 1.25 µm, and the current collapse was measured.

Figure 9:
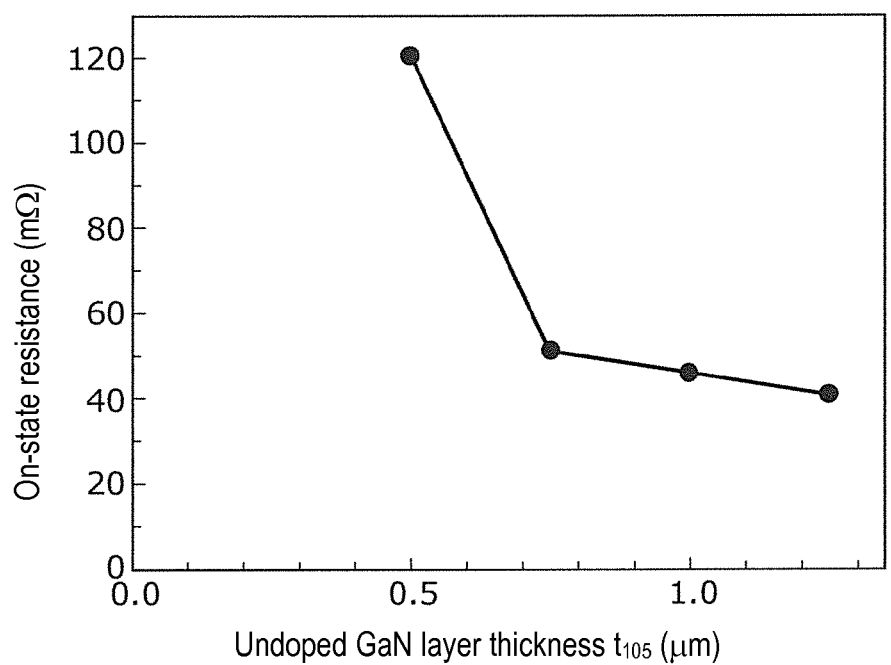
FIG. 9 is a graph showing the relationship between the thickness of the undoped GaN layer and the ON-state resistance at switching.

FIG. 9 is a graph showing the relationship between the thickness of the undoped GaN layer and the ON-state resistance at switching. The graph of FIG. 9 shows the relationship between the ON-state resistance $R_{ON}$ of the device when switched at $V_{dd}$=400 V and the thickness of undoped GaN layer 105. It can be seen that, when the thickness of undoped GaN layer 105 is equal to or greater than 0.75 µm, the ON-state resistance at switching does not rise and the current collapse does not occur.

The reason of this phenomenon is described with reference to FIG. 1. When a high voltage is applied to the field-effect transistor in an OFF state, electrons are trapped by codoped layer 104 containing C and Si as impurities. The electrons have an extremely deep trap level. Since the electrons are negatively charged, they bring about the effect that may be realized by application of a negative bias to the channel, when the device is turned ON. Hence, the channel becomes narrow. This is the mechanism of the current collapse occurrence. On the other hand, since undoped GaN layer 105 does not contain any electron traps, the current collapse is not triggered. Hence, by fully separating codoped layer 104 that triggers the current collapse from the channel layer, the channel is less likely to become narrow.

As can be seen from the result described above, by setting the thickness of undoped GaN layer 105 to be equal to or greater than 0.75 µm, codoped layer 104 and the channel can be separated from each other by 0.75 µm or more. Accordingly, the leakage current can be reduced while suppressing the occurrence of the current collapse in an OFF state and at an actual operational voltage.

Second Exemplary Embodiment

Figure 10:
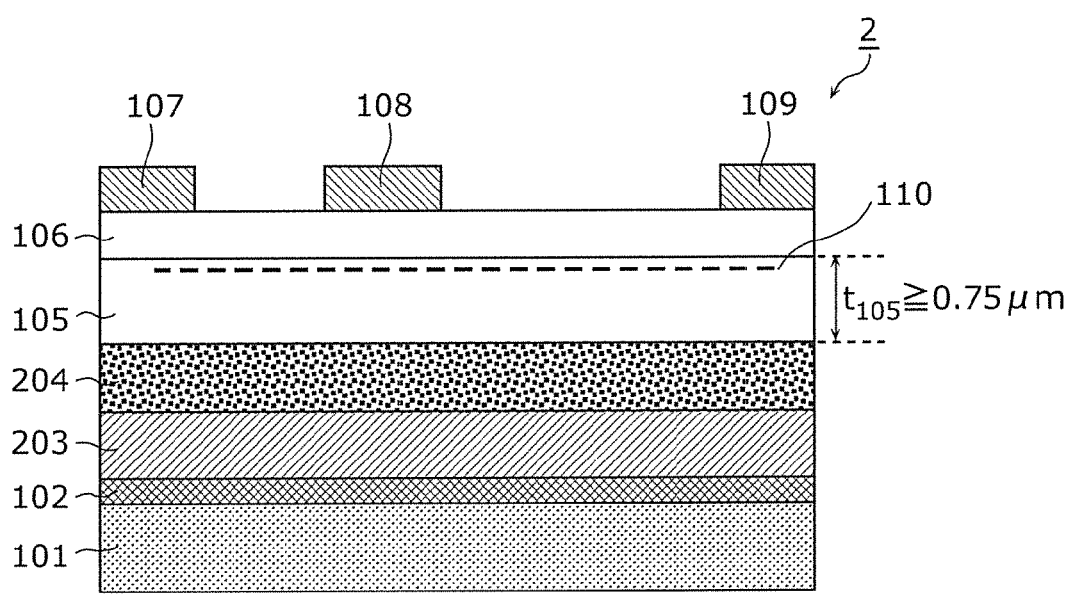
FIG. 10 is a cross-sectional view of a field-effect transistor according to a second embodiment.

FIG. 10 is a cross-sectional view of a field-effect transistor according to a second exemplary embodiment. In field-effect transistor 2 shown in FIG. 10, what are stacked in order on p-type Si substrate 101 are: AlN buffer layer 102 by a thickness of 200 nm; superlattice layer 203 by a thickness of 2 µm, the superlattice being made up of 5 nm of AlN and 20 nm of GaN and codoped with Si and C; auto-doped layer 204 by a thickness of 0.5 µm, auto-doped layer 204 containing C by a concentration of $1\times10^{19}/cm^3$ by auto-doping; undoped GaN layer 105 by a thickness of 0.75 µm, the concentration of C of undoped GaN layer 105 being set to be equal to or less than $1\times10^{17}/cm^3$ for suppressing the current collapse; and undoped AlGaN layer 106 by a thickness of 50 nm. A source electrode, a drain electrode and a gate electrode are similarly structured as those of field-effect transistor 1.

Superlattice layer 203 is a first semiconductor layer formed by a superlattice layer structured by $Al_xGa_{1-x}N$ and $Al_yGa_{1-y}N$ being a first nitride semiconductor. Here, superlattice layer 203 codoped with Si and C for reducing leakage is doped with Si as the donor by $1\times10^{17}/cm^3$ and carbon (C) as the acceptor by $5\times10^{17}/cm^3$. Further, in order to form a highly insulating GaN epitaxial film, the concentration of Si used for compensating for C functioning as the acceptor must not exceed the concentration of C, because GaN becomes conductive when the concentration of Si exceeds the concentration of C. That is, superlattice layer 203 contains carbon (C) and Si as impurity elements. Further, the concentration of C is equal to or higher than $5\times10^{17}/cm^3$, and the concentration of Si is lower than the concentration of C.

Further, undoped GaN layer 105 is a second semiconductor layer formed by GaN being a second nitride semiconductor, and the concentration of C in undoped GaN layer 105 is equal to or lower than $1\times10^{17}/cm^3$.

Still further, a thickness $t_{105}$ of undoped GaN layer 105 is equal to or greater than 0.75 µm.

Undoped AlGaN layer 106 is formed on undoped GaN layer 105. Undoped AlGaN layer 106 is a third semiconductor layer formed by AlGaN being a third nitride semiconductor with a band gap wider as compared to that of the second nitride semiconductor.

When a high voltage is applied to field-effect transistor 2 structured as above in an OFF state, electrons are trapped by superlattice layer 203 which contains C and Si as impurities. These electrons have an extremely deep trap level. Since these electrons are negatively charged, they bring about the effect that may be realized by application of a negative bias to the channel, when the device is turned ON. Hence, the channel becomes narrow. On the other hand, since undoped GaN layer 105 does not contain any electron traps, the current collapse is not triggered. Hence, by fully separating superlattice layer 203 that triggers the current collapse from the channel layer, the channel is less likely to become narrow.

As can be seen from the result described above, by setting the thickness of undoped GaN layer 105 to be equal to or greater than 0.75 µm, superlattice layer 203 and the channel can be separated from each other by 0.75 µm or more. Accordingly, the leakage current can be reduced while suppressing the occurrence of the current collapse in an OFF state and at an actual operational voltage.

In the foregoing, though the description has been given of the field-effect transistor of the present disclosure based on the exemplary embodiments, the field-effect transistor of the present disclosure is not limited to the above-described exemplary embodiments. The present disclosure includes other exemplary embodiments realized by any combination of any constituents in the exemplary embodiments, variations obtained by making any changes which can be devised by a person skilled in the art within the range not deviating from the gist of the present disclosure to the exemplary embodiments, and a variety of devices including the field-effect transistor of the present disclosure.

A field-effect transistor apparatus obtained by the present disclosure is useful as a power transistor used in a power supply circuit of a consumer appliance such as an air conditioner.

What is claimed is:
1. A field-effect transistor comprising:
  a first semiconductor layer made of a first nitride semiconductor and formed on a substrate;
  a second semiconductor layer made of a second nitride semiconductor and formed on the first semiconductor layer; and
  a third semiconductor layer made of a third nitride semiconductor with a band gap wider than that of the second nitride semiconductor and formed on the second semiconductor layer, wherein:
  the first semiconductor layer includes carbon (C) and Si as impurity elements,
  an impurity concentration of carbon (C) in the first semiconductor layer is equal to or higher than $5\times10^{17}/cm^3$,
  an impurity concentration of Si in the first semiconductor layer is lower than the impurity concentration of carbon (C) in the first semiconductor layer, an impurity concentration of carbon (C) in the second semiconductor layer is equal to or lower than $1 \times 10^{17}/\text{cm}^3$, and a thickness of the second semiconductor layer is equal to or greater than 0.75 μm.

2. The field-effect transistor according to claim 1, wherein the first nitride semiconductor is made of $Al_xGa_{1-x}N$ ($0 \leq x \leq 1$), the second nitride semiconductor is made of GaN, and the third nitride semiconductor is made of AlGaN.

3. The field-effect transistor according to claim 1, wherein the first nitride semiconductor is made of $Al_xGa_{1-x}N$ ($0 \leq x \leq 1$) and $Al_yGa_{1-y}N$ ($0 \leq y \leq 1$, $x \neq y$), the first semiconductor layer is a superlattice layer made of the first nitride semiconductor, the second nitride semiconductor is made of GaN, and the third nitride semiconductor is made of AlGaN.

4. A field-effect transistor comprising:

a first semiconductor layer made of a first nitride semiconductor and layered on a substrate;

a second semiconductor layer made of a second nitride semiconductor and formed on the first semiconductor layer; and a third semiconductor layer made of a third nitride semiconductor with a band gap wider than that of the second nitride semiconductor and formed on the second semiconductor layer, wherein:

the first semiconductor layer contains:

a first impurity having an ionization energy Ea and a concentration Na; and a second impurity having an ionization energy Ed smaller than the ionization energy Ea, and a concentration Nd smaller than the concentration Na, a trap level is formed at the first semiconductor layer, the trap level having an activation energy greater than a sum of the ionization energy Ea and the ionization energy Ed, an impurity concentration of carbon (C) in the second semiconductor layer is equal to or lower than $1 \times 10^{17}/\text{cm}^3$, and a thickness of the second semiconductor layer is equal to or greater than 0.75 μm.

5. The field-effect transistor according to claim 4, wherein the first nitride semiconductor is made of $Al_xGa_{1-x}N$ ($0 \leq x \leq 1$), the second nitride semiconductor is made of GaN, and the third nitride semiconductor is made of AlGaN.

6. The field-effect transistor according to claim 4, wherein the first nitride semiconductor is formed by $Al_xGa_{1-x}N$ ($0 \leq x \leq 1$) and $Al_yGa_{1-y}N$ ($0 \leq y \leq 1$, $x \neq y$), the first semiconductor layer is a superlattice layer made of the first nitride semiconductor, the second nitride semiconductor is made of GaN, and the third nitride semiconductor is made of AlGaN.

* * * * *